(12) United States Patent
Hart

(10) Patent No.: US 9,618,543 B2
(45) Date of Patent: Apr. 11, 2017

(54) CONTROL SYSTEM FOR MULTI-PHASE ROTARY MACHINES

(71) Applicant: Control Techniques Limited, Newtown (GB)

(72) Inventor: Simon David Hart, Welshpool (GB)

(73) Assignee: CONTROL TECHNIQUES LIMITED, Newtown (GB)

(*) Notice: Subject to any disclaimer, the term of this patent is extended or adjusted under 35 U.S.C. 154(b) by 207 days.

(21) Appl. No.: 14/206,824

(22) Filed: Mar. 12, 2014

(65) Prior Publication Data

US 2014/0285179 A1  Sep. 25, 2014

(30) Foreign Application Priority Data

Mar. 19, 2013  (GB) .................................. 1305034.9

(51) Int. Cl.

| | | |
|---|---|---|
| *G01R 19/18* | (2006.01) | |
| *G01R 15/18* | (2006.01) | |
| *G01R 19/00* | (2006.01) | |
| *G01R 19/25* | (2006.01) | |
| *H02M 7/5387* | (2007.01) | |
| *H02M 1/00* | (2006.01) | |

(52) U.S. Cl.
CPC .......... *G01R 19/0092* (2013.01); *G01R 19/25* (2013.01); *H02M 7/5387* (2013.01); *H02M 2001/0009* (2013.01)

(58) Field of Classification Search
CPC . G01R 19/0092; G01R 19/25; H02M 7/5387; H02M 2001/0009

USPC .......................................... 324/86, 120, 127
See application file for complete search history.

(56) References Cited

U.S. PATENT DOCUMENTS

| | | | |
|---|---|---|---|
| 7,560,897 B2 | 7/2009 | Watanabe | |
| 7,728,537 B2 | 6/2010 | Tomigashi | |
| 8,040,086 B2 | 10/2011 | Yamamoto | |
| 8,106,622 B2 | 1/2012 | Aoki et al. | |
| 8,223,521 B2 | 7/2012 | Inoue et al. | |
| 8,502,524 B2 | 8/2013 | Leppänen et al. | |
| 2003/0071633 A1* | 4/2003 | Fedirchuk | H02H 7/22 324/529 |
| 2011/0101906 A1* | 5/2011 | Tagome | H02K 3/28 318/722 |

(Continued)

FOREIGN PATENT DOCUMENTS

| | | |
|---|---|---|
| JP | 2001-119957 | 4/2001 |
| JP | 2003-164159 | 6/2003 |

(Continued)

*Primary Examiner* — Farhana Hoque
(74) *Attorney, Agent, or Firm* — Harness, Dickey & Pierce, P.L.C.

(57) ABSTRACT

A method and a control system for a multiphase-phase inverter system, the control system comprising an electric current detection circuit and a processor, wherein each phase of an electrical cycle is separated into a plurality of sections, inputs from the electric current detection circuit are received, each input indicating a measured phase current, and a phase current is calculated in each section, wherein the phase current calculation in at least one of the sections is determined from a changing ratio of the value of the phase current calculated from the measured values of the other phase currents in the multiphase system and the measured value of the phase.

13 Claims, 5 Drawing Sheets

(56) References Cited

U.S. PATENT DOCUMENTS

2012/0112673 A1* 5/2012 Maekawa ................. H02P 6/16
318/400.06

FOREIGN PATENT DOCUMENTS

| JP | 4122806 | 7/2008 |
| JP | 2010-193539 | 9/2010 |
| JP | 2011-004538 | 1/2011 |

* cited by examiner

CONTROL SYSTEM FOR MULTI-PHASE ROTARY MACHINES

CROSS-REFERENCE TO RELATED APPLICATION

This application claims the benefit and priority of Great Britain Patent Application No. 1305034.9 filed Mar. 19, 2013. The entire disclosure of the above application is incorporated herein by reference.

FIELD

The present application relates to a control system for a multi-phase rotary machine, designed to control the rotation of a rotor of a multi-phase rotary machine based upon current in each phase.

BACKGROUND AND SUMMARY

Known control systems for multiphase rotary electric machines are designed to drive a drive system comprising a plurality of switching elements connected to a multiphase rotary electric machine to thereby control rotation of the multiphase rotary electric machine. For instance, FIG. 1 shows a typical drive system for a multiphase rotary electric machine. The drive system comprises a plurality of switching elements 102a, 102b, 102c and 104a, 104b and 104c for a three phase rotary electric machine. One set of switching elements 102a, 102b, 102c is known as the high side switching elements and the other set of switching elements 104a, 104b, 104c is known as the low side switching elements. The control system is designed to drive a pair of high and low side switching elements for each phase winding of the machine to output a sinusoidal voltage to be applied to each of the three phase windings of the motor. This allows torque to be created in the three phase windings with little ripple. A shunt resistor 108a, 108b, 108c is provided in series with each of the low side switching elements 104a, 104b, 104c to provide a cost effective way of measuring current.

FIG. 2 shows how the three phase currents I_U, I_V, I_W (also referred to herein as Ia, Ib and Ic) alter with the electrical angle. Prior art methods select two raw current measurements and deduce the third based on the fact that all three phase currents must sum to zero. These methods assume that the phase difference between the voltages and currents will be small and thus select the phase with the most positive voltage to be calculated from the other two. Hence the raw data used in the calculation changes three times per electrical cycle. There will be a discontinuity in the calculated currents at the three section boundaries if there are any offset errors present in the raw measurements.

The use of shunts has various disadvantages. Current can only be measured in a particular phase when it flows either through the low side switching element 104n or its antiparallel diode 106n which necessitates deducing the third current from the other two phases. Any offset errors in the raw current measurements result in discontinuities which greatly affect the performance of the closed loop current controllers. The raw current measurements are subject to large spikes directly after the switching instance due to cable charging currents. The current should be sampled a delay after the lower switching element has begun to conduct to prevent the spikes from affecting the measurement. This delay, added to the time required to perform the analogue conversion, results in a minimum time during which the lower switching element must conduct so that the raw measurement can be used. This issue becomes of more concern when the modulation index is high as the time during which current flows through the shunt resistors at certain points in the electrical cycle becomes short.

Inverters that employ bootstrap supplies for the high switching elements require that the lower switching element is on for enough time to charge the bootstrap supply within the period during which the supply would discharge. The insertion of large "charging lower on periods" reduces the robustness of closed loop current controllers.

DRAWINGS

The proposed technique will be described further by way of example only with reference to the accompanying figures, in which.

DETAILED DESCRIPTION

Figure 1:
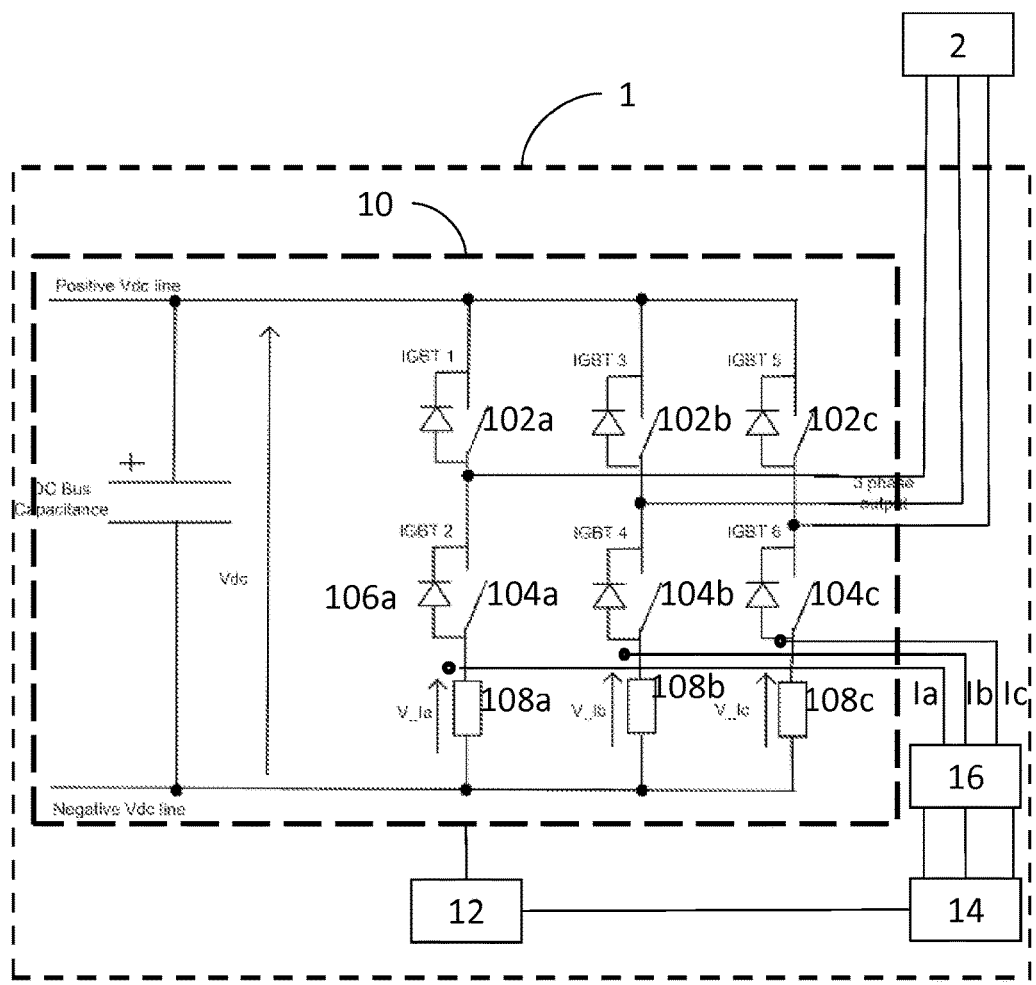
FIG. 1 shows an example of a multiphase control apparatus for a multiphase rotor.
Figure 2:
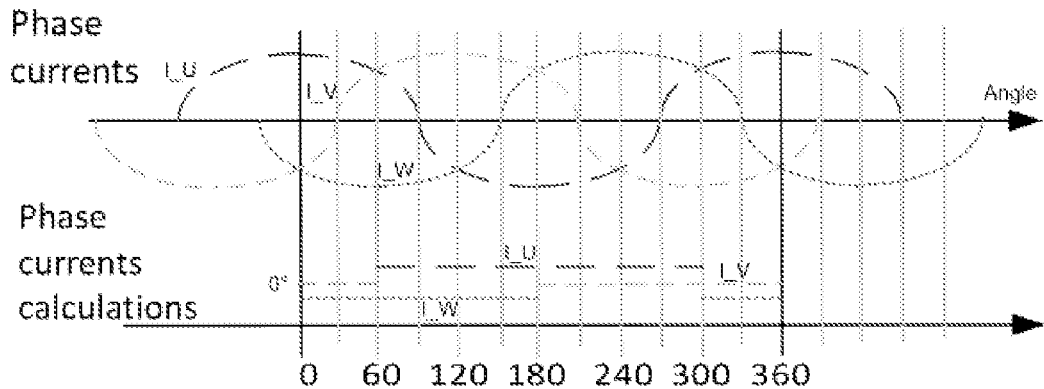
FIG. 2 shows typical three phase sinusoidal current wave forms for each phase of a three phase rotor.

As shown in FIG. 1, a multiphase motor control apparatus 1 provides a multiphase output to drive a multiphase motor 2 which has plurality of phases. In this application a three-phase embodiment will be described as this is the most common multiphase system used worldwide. However it will be clear to a person skilled in the art that the technique described herein may be applied to other multiphase systems.

The control apparatus 1 includes an inverter 10 having a bridge circuit comprising six switching elements 102a, 102b, 102c, and 104a, 104b, 104c and a drive circuit 12 which controls the output of each switching element 102, 104. In the examples shown each switching element 102, 104 is shown as an Insulated Gate Bipolar Transistor (IGBT), which is a switching element suited to high speed operation. However, other switching elements may be used. In this bridge circuit, the coil of each coil phase of the motor 2 is driven by the switching element 102 in the high side and the switching element 104 in the low side. A diode 106 is contained within each phase of the bridge circuit to provide a continuous current path even if the associated lower switching element 104 is not active. A shunt resistance 108 is provided in series with the low side switching element 104 for measuring the electric current value which flows through each low side switching element 104 to the negative the DC line.

The control apparatus includes a drive circuit 12 to carry out control of the voltage of each of the switching elements 102, 104 based on a control signal. In carrying out control of the inverter 10 (which drives each coil phase by the switching element 102 on the high side and switching element 104 on the low side) control of the up and down phase of the switching element 102 of the high side and the low switching element 104 is implemented. A processor 14 is provided to control the drive circuit 12 and other elements of the circuit. An electric current detection circuit 16 receives the measurement from each shunt resistor 106 and outputs these values to the processor 14. The processor 14 is configured so that the electric current value which flows through the switching element 104 to which the shunt resistor 106 is connected can be calculated based on the resistance voltage value. Furthermore, processor 14 calculates the coil phase current value which flows into each coil phase of the motor based on the electric current value which flows through each said switching element 104.

The current may be at a phase offset from the output voltage, dependent on the operating conditions, which alters the angle at which the two raw current measurements should be selected.

According to the proposed technique, the processor 14 receives the measurements from the electric current detection circuit 16 and determines a phase current in a multiphase inverter system from a changing ratio of the calculated value of the first current calculated from the measured values of the second and third currents and the measured value of the first current.

For a three-phase system, for a given phase this may be written mathematically as:

$$I_{phase(n)} = P \times I_{phase(n)\_calculated} + Q \times I_{phase(n)\_measured}$$

where $I_{phase(n)\_calculated}$ is the current for the particular phase n calculated from the measured values of the other phases;

$I_{phase(n)\_measured}$ is the current measured for phase n

P+Q=1, and

P takes a value greater than or equal to 0 and less than or equal to 1 and

Q takes a value greater than or equal to 0 and less than or equal to 1

P may change from 0 to 1 as Q changes from 1 to zero or vice versa.

Thus the phase current for a particular phase may be calculated initially (at the point where the particular phase current is the most positive of the three phase currents) from the measured currents in the other phases (i.e. P equal to 1 and Q equal to 0) and subsequently determined as a linearly increasing ratio of the calculated value (calculated from the measured currents in the other phases) and a raw measured value of the phase current for the particular phase (i.e P decreasing from 1 to 0 as Q increases from 0 to 1) until another phase current is the most positive at which point the phase current for a particular phase is determined from the measured value of the particular phase current. The phase current for the particular phase is then determined as a linearly decreasing ratio of the calculated value (calculated from the measured currents in the other phases) and a raw measured value of the phase current for the particular phase (i.e P increasing from 0 to 1 as Q decreases from 1 to 0) to finish at the phase current for the particular phase being finally calculated from the measured currents in the other phases.

Figure 3:
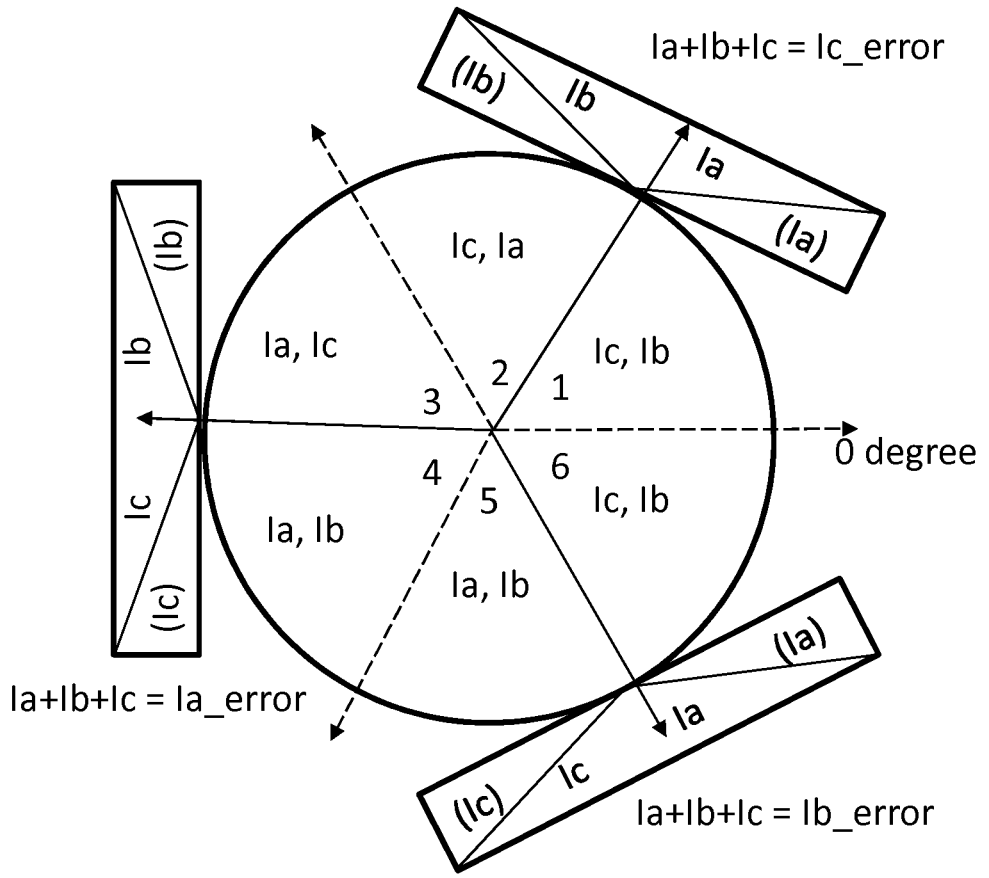
FIG. 3 shows a schematic diagram illustrating an embodiment of the current determination for each phase of a three phase control apparatus.
Figure 4:
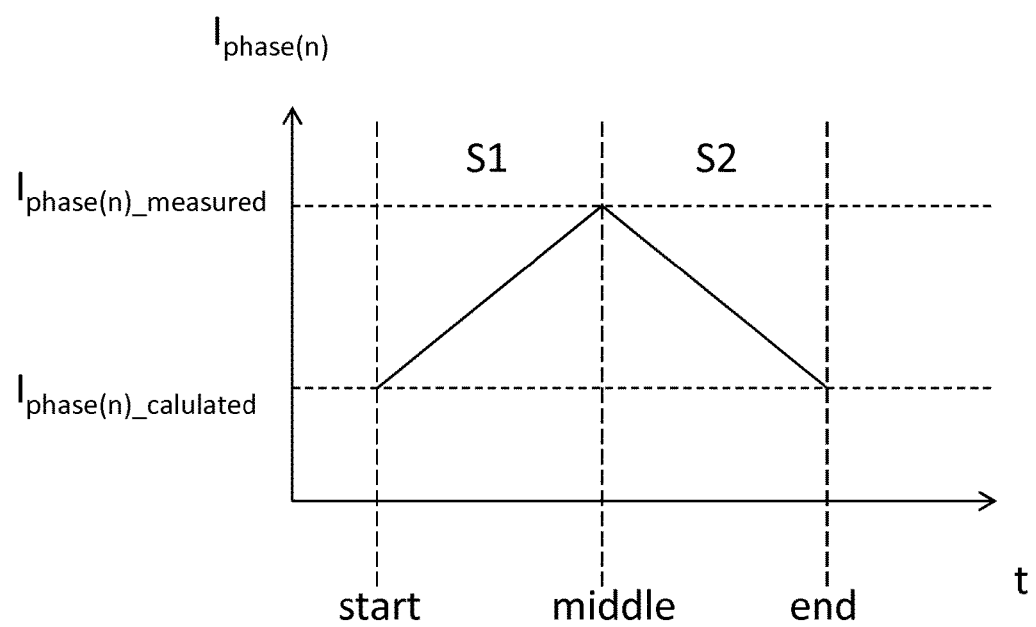
FIG. 4 shows an example of the determination of a current for a given phase, for the period of that phase from the start to the middle to the end, for the embodiment shown in FIG. 3.

This is illustrated in FIGS. 3 and 4 of the drawings.

The proposed technique separates each phase of the electrical cycle into a plurality of sections rather than a single section for each phase. For each phase, the plurality of sections may be even in number. For a given cycle, each phase may be considered as being separated into a plurality of sections, with the phase current in at least one section being determined from a changing ratio of the value of the phase current calculated from the measured values of the other phase currents in the multiphase system and the measured value of the phase. The number of sections in each plurality of sections may be an even number of sections e.g. each phase may be divided into two, four, six etc. sections.

In the example shown in FIG. 3, each phase A, B, C is divided into two sections (the sections being numbered consecutively from 1 to 6). Currents in brackets indicate currents that have been calculated from the other two and currents without brackets indicate that the measured current values are used directly.

At the beginning of the first section 1, the current Ia is calculated from the measured currents Ic and Ib. At the end of 1 the raw measured value of Ia is used directly. As the electrical angle increases through section 1, the value used for Ia is the linearly changing ratio of the value of Ia calculated from the measured currents Ic and Ib and the measured value for Ia. For example, half way through section 1 the value used for Ia is half the value calculated from Ic and Ib and half the value of Ia as measured. At the boundary between sections 1 and 2 the three measured currents are used directly. In section 2, the value used for the Ib current is the linearly changing ratio of the measured value to the calculated value. At the end of section 2, the current Ib is calculated from the measured currents Ia and Ic.

The other sections repeat this pattern for the other currents.

FIG. 4 illustrates this further. Thus the phase current $I_{phase(n)}$ in a N-phase inverter system is determined from a linearly changing ratio of the value of the phase current $I_{phase(n)}$ calculated from the measured values of the (N−1) other phase currents and the measured value $I_{phase(n)}$ of the phase. In FIG. 4 the current for the particular phase n calculated from the measured values of the other phases (indicated as $I_{phase(n)\_calculated}$) is shown to be less than the current measured for that phase (indicated as $I_{phase(n)\_measured}$). However this is for illustrative purposes only and at any point in time $I_{phase(n)\_calculated}$ may be more or less than $I_{phase(n)\_measured}$.

An offset value may be calculated and subtracted from the measured current value $I_{phase(n)\_measured}$ when the measured value for the particular phase is used in isolation of the value $I_{phase(n)\_calculated}$ calculated from the measured values of the other phases.

FIGS. 3 and 4 show an implementation in which, for a given phase n of an N-phase system, the phase current for the particular phase is initially calculated from the measured currents in the other phases and subsequently determined as a changing ratio of the calculated value and the raw measured value of the phase current for the particular phase, with the ratio increasing and then decreasing. The ratio may change linearly with phase angle or non-linearly.

A three-phase implementation has been described as this is the most common balanced multiphase system in use worldwide. However the technique may be applied to other multiphase systems in which it is possible to obtain current measurements from all current paths into the load and the current profile is such that when it is not possible to measure one phase current it is possible to measure all the other phase currents.

According to another embodiment, for a three-phase inverter system, the method may comprise separating an electrical cycle into twelve sections (each phase being divided into four sections) and calculating a phase current in each section, wherein in a given section the phase current calculation comprises one of the following:

the phase current is based on a first calculated current and a second and a third measured currents;

the phase current is based on a linearly changing ratio of the calculated and measured value of the first current and the measured second and third currents;

the phase current is based on the measured values of the three currents.

This is applicable to a three-phase inverter system, for example, having shunt resistances in series with three lower insulated-gate bipolar transistors (IGBTs).

Again the proposed technique separates each phase of the electrical cycle into a plurality of sections rather than a single section for each phase. In the example shown in FIG. 5, each phase is divided into four sections (the sections are sequentially numbered 1 to 12 in FIG. 4.) Currents in brackets indicate currents that have been calculated from the other two and currents without brackets indicate that the measured current values are used directly.

In section 1, the current Ia is calculated from the measured currents Ic and Ib. At the beginning of section 2, the value of Ia is as calculated as in section 1. At the end of section 2 the raw measured value of Ia is used directly. As the electrical angle increases through section 2, the value used for Ia is the linearly changing ratio of the value of Ia calculated from the measured currents Ic and Ib and the measured value for Ia. For example, half way through section 2 the value used for Ia is half the value calculated from Ic and Ib and half the value of Ia as measured.

At the boundary between sections 2 and 3 the three measured currents are used directly.

In section 3, the value used for the Ib current is the linearly changing ratio of the measured value to the calculated value. In section 4, the current Ib is calculated from the measured currents Ia and Ic.

The other sections repeat this pattern for the other currents.

Figure 5:
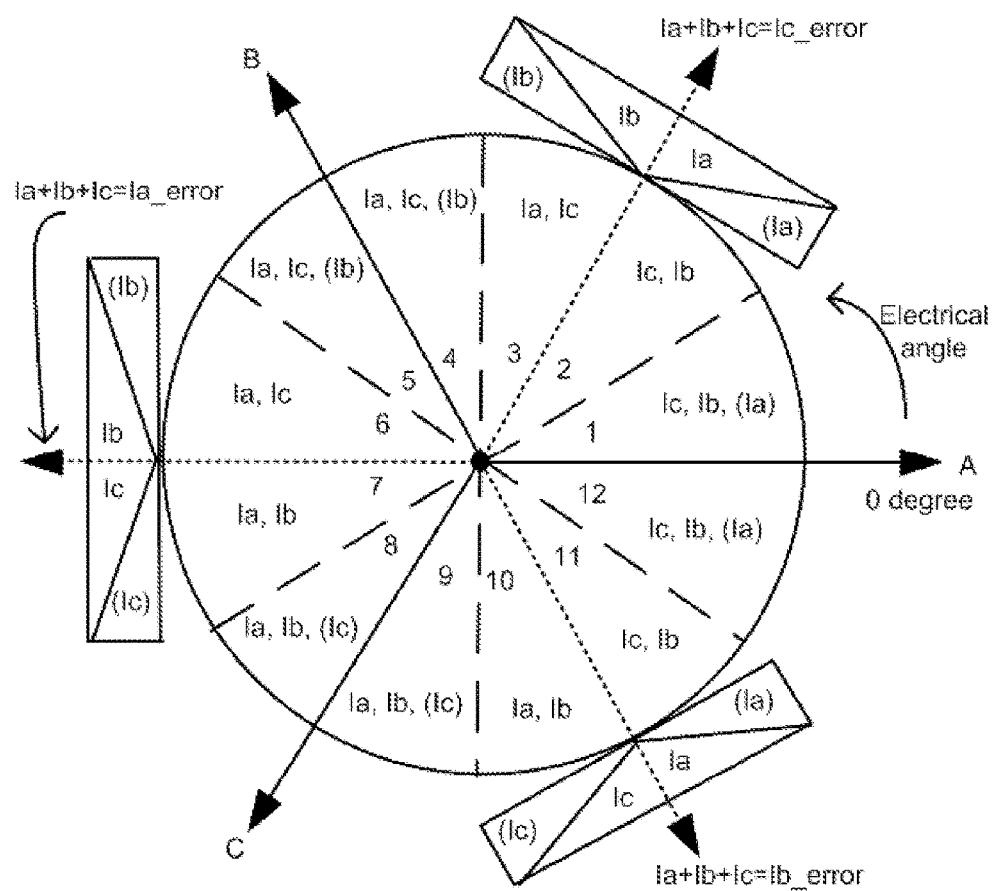
FIG. 5 shows a schematic diagram illustrating a second embodiment of the current determination for each phase of a three phase control apparatus.
Figure 6:
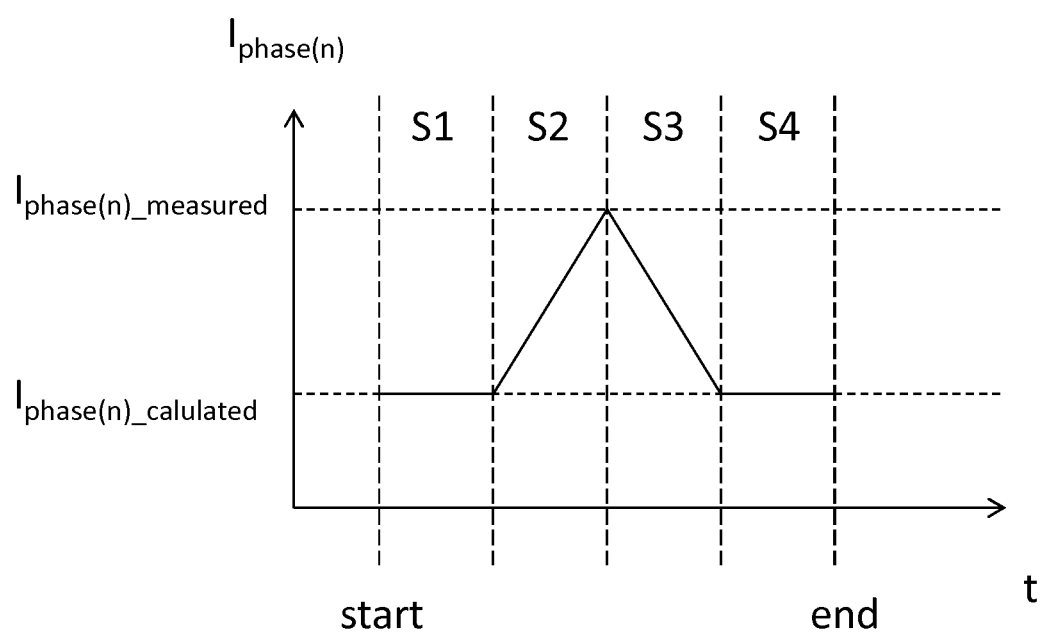
FIG. 6 shows an example of the determination of a current for a given phase, for the period of that phase from the start to the middle to the end, for the embodiment shown in FIG. 5.

FIG. 6 illustrates the embodiment shown in FIG. 5 in which each phase of an electrical cycle is separated into four sections. FIG. 6 shows an implementation in which, for a given phase n of an N-phase system, the phase current for the particular phase is initially calculated from the measured currents in the other phases (S1) and subsequently determined as a linearly changing ratio of the calculated value and the raw measured value of the phase current for the particular phase, with the ratio increasing (S2) and then decreasing (S3). Finally (S4) the phase current for the particular phase is calculated from the measured currents in the other phases.

Detection and Reduction of Raw Measurement Offset Error Effects

FIGS. 3 and 5 shows that, for a three-phase system, there are three angles (60°, 180°, 300° or $\pi/3$, $\pi$, $5\pi/3$ radians) during the electrical cycle at which all three measured currents could be used directly. In practice it is unlikely that the reference angle will coincide with any of the three angles exactly so an "offset effect reduction" may be implemented when the electrical angle is within a small range about the true angle.

When the three measured currents can be used directly they are summed. In an ideal system, the sum would be zero. The result of the sum is used to provide an offset for one of the currents i.e:

Offset $I\_offset = Imeas\_a + Imeas\_b + Imeas\_c$

The current to which the offset error I_offset is assigned may be the most negative of the three currents, so for example on the boundary between sections 2 and 3 as shown in FIG. 5 the offset is assigned to phase c.

The control system 10 may be arranged to trip if any offset is greater than a threshold value defined as the limit for the system, as an offset greater than a threshold value denotes that at least one of the phase measurements is out of tolerance.

If the offset is smaller than the trip level, it may be filtered with a time constant, for example of at least 10 seconds or 10 electrical cycles. In one embodiment, the offset detection and correct system is not used if the output electrical frequency is less than 1 Hz. Offset errors can occur due to measurement circuit component value changes and amplifier offset changes which are slow moving. The slow time constant maintains the closed loop current controller stability.

The filtered offset may be subtracted from the raw measured current value whenever the raw measured current value is used to calculate the phase currents. The offset does not need to be subtracted when the new offset value is calculated from the three raw measured currents. The offset is measured when all of the three phase currents are at their most measureable, e.g. on the boundary from section S2 and S3 in FIG. 6. When calculating the new offset the phase measurements are not modified by a "filtered" offset.

The correction of offsets in the raw measurements may not remove the actual offset as the method may assume the phase to which the offset is applied and that the offset belonged solely to that phase. The intent of the "offset effect reduction" method is to remove the effect of the offsets on the current controller by reducing the discontinuities on the boundaries of the sections, for example the twelve sections described with reference to FIGS. 5 and 6.

Current measurements may be calibrated by the removal of any measured initial offset before the inverter begins to switch. Hence the offset correction described may be reset to zero when the inverter is not active.

Reduction in the Effect of the Minimum Time for Which the Lower Switching Element Conducts The raw current measurements will be subject to large spikes directly after the switching instance due to cable charging currents. The current must be sampled a delay after the lower switching element has begun to conduct to prevent the spikes from affecting the measurement. This delay, added to the time required to perform the analogue conversion, results in a minimum time during which the lower switching element must conduct so that the raw measurement can be used. This issue becomes of more concern when the modulation index is high as the time during which current flows through the shunt resistors at certain points in the electrical cycle becomes short.

The current feedback system can detect when the time the lower switching element has been on for is below the minimum for which the measurement is useful. Prior art methods impose a minimum on-time for a lower switching element to alleviate this issue, however this restricts the maximum peak to peak voltage that can be output by the inverter and removes the possibility of pulse dropping. This reduces the closed loop current controller's ability to control the current.

It is therefore proposed to use the last valid measurement value when the lower switching element is on for less than the minimum time required for valid measurement. To prevent this value from being more than two sample cycles old, the inverter may be arranged to switch on the lower switching element for the minimum time required for measurement during the next PWM period even if the calculated time is less than this.

Thus, if the calculated on-time (t on_lower switching element_meas) for a lower switching element remains below the minimum time (t on_lower switching element_min) required for measurement for a continuous group of PWM periods, the method proposed may alternate between using the last valid measurement I_meas (from the last sample cycle) and forcing the lower switching element on for the minimum time to allow for measurement of the phase current. This provides a balance between the range of output voltage available and the ability for the current controllers to be provided with fresh data.

Thus, for t on_lower switching element_min=x secs t on_lower switching element_meas=y secs when y<x, then alternately (i.e. one then the other) use last measurement for I_meas and prolong on period of lower switching element to allow measurement of I_meas.

This technique may be used in combination with or alternatively to the technique described above of splitting a phase into a plurality of sections and calculating a phase current in each section, wherein the phase current calculation in at least one of the sections is determined from a changing ratio of the value of the phase current calculated from the measured values of the other phase currents in the multiphase system and the measured value of the phase.

Reduction of the Effect of the Bootstrap Supply Charge Pulses

Following on from the last sub-section, another proposed technique concerns the charging of the bootstrap supplies which may be used by the upper switching element drivers. A bootstrap supply in its simplest embodiment, as described in common literature, consists of a capacitor for energy storage, a resistor to limit the capacitor charging current, a zener diode to limit the voltage across the capacitor and a diode to prevent discharge when the upper switching element is conducting. The bootstrap supply circuit is connected across the upper switching element and so is charged whenever the lower switching element is on. The charging of the bootstrap supply requires the lower switching element to be on for a time greater than, or equal to, the time required to charge the capacitive element of the bootstrap supply. The capacitive element provides energy to the upper switching element drivers when the lower switching element is not conducting.

The control system 1 is unable to monitor the level of the bootstrap supply so prior art methods insert a long lower pulse if the lower switching element has not been on for sufficient time during the calculated time during which the bootstrap capacitor would discharge. This insertion of long on-time for the lower switching element destabilises closed loop current controllers necessitating a reduction in their bandwidth.

The proposal removes the need for the long lower on time charging pulses by providing at least alternating pulses of length equal to the minimum time required for valid measurement as described in the last sub-section. The minimum time required for valid measurement is longer than the time required for the bootstrap supply to be charged, by design.

Thus, if the calculated on-time (t on_lower switching element_charge_calc) available for a lower switching element to charge a bootstrap capacitor remains below the minimum time (t on_lower switching element_charge_min) required to charge a bootstrap capacitor for a continuous group of PWM periods, the method proposed may alternate between the using calculated on-time and forcing the lower switching element on for the minimum time to allow for full charging of the bootstrap capacitor. This provides a balance between the bootstrap capacitor being fully charged and avoiding continuous long on-times for the lower switching element.

Thus, for t on_lower switching element_charge_calc=x secs t on_lower switching element_charge_min=y secs when x<y, then alternately (i.e. one then the other) turn on lower switching element for calculated time and prolong the on period of the lower switching element to allow charging of the bootstrap capacitor.

This technique may be used in combination with or alternatively to the techniques described above of: splitting a phase into a plurality of sections and calculating a phase current in each section, wherein the phase current calculation in at least one of the sections is determined from a changing ratio of the value of the phase current calculated from the measured values of the other phase currents in the multiphase system and the measured value of the phase; and alternating between using the last valid measurement I_meas (from the last sample cycle) and forcing the lower switching element on for the minimum time to allow for measurement of the phase current. When the minimum time required for charging the bootstrap capacitor (t on_lower switching element_charge_min) is less than the minimum time required for phase current measurement (t on_lower switching element_meas), then it is not necessary to prolong the on period of the lower switching element to allow sufficient charging of the bootstrap capacitor.

Reduction in the Effect of Current Phase Offset

The current will be phase offset from the output voltage which alters the angle at which the two raw current measurements should be selected when the inverter is connected to an inductive load. The relationship is made more complex when the load is a rotating machine and when the machine can regenerate.

A further technique assumes that the output currents and voltages will comprise a fundamental sinusoidal wave and that the closed loop current controllers have sufficient bandwidth so the reference demand current can be used instead of the measured current. This in turn increases the control system's robustness to measurement noise and reduces the numerical computation involved.

The method modifies the angle used when determining which of the sections to use, for instance which of the twelve sections as shown in FIG. 4. The modification is calculated every electrical cycle and is incrementally implemented during the next electrical cycle. The maximum angular modification and the rate of change are limited depending on the load and system parameters.

Thus, the processor 14 may receive signals indicative of the phase currents and also the phase voltages and determine the error between the phase and the value of the current/voltage demanded by the load and the measured values and use this error to correct the phase current calculation.

This technique may be used in combination with or alternatively to the techniques described above of: splitting a phase into a plurality of sections and calculating a phase current in each section, wherein the phase current calculation in at least one of the sections is determined from a changing ratio of the value of the phase current calculated from the measured values of the other phase currents in the multiphase system and the measured value of the phase; alternating between using the last valid measurement I_meas (from the last sample cycle) and forcing the lower switching element on for the minimum time to allow for measurement of the phase current; and providing at least alternating pulses of length equal to the minimum time required for valid measurement as described in the last sub-section.

In this specification, phases have been referred to as A, B and C and U, V and W. These terms are used interchangeably throughout the specification.

The invention claimed is:

1. A method for measuring phase currents in a multiphase inverter system, the method comprising the following steps:
separating each phase of an electrical cycle into a plurality of sections based on an electrical angle of each phase; and
determining a first phase current of a first phase in at least one section of the plurality of sections from a changing ratio of a value of the first phase current calculated from measured values of other phase currents in the multiphase system and a measured value of the first phase current.

2. A method according to claim 1, wherein the changing ratio is a linearly changing ratio.

3. A method according to claim 1 wherein a phase current in at least one other of the sections is determined from a measured value of the phase current.

4. A method according to claim 3 further comprising, for a section in which the phase current is determined from the measured value of the phase current, alternating between using a last valid measurement of the phase current and forcing a switching element on for the minimum time to allow for measurement of the phase current.

5. A method according to claim 1, wherein the multiphase inverter system comprises a plurality of switching elements and a capacitor associated with at least one of the switching elements, and wherein the method further comprises calculating an on-time available for a switching element to charge the capacitor, comparing the calculated on-time with a minimum time required to charge a capacitor and, when the calculated on-time is less than a minimum time required to charge a capacitor, alternating between turning on the switching element for the calculated on-time and turning on the switching element for the minimum time to allow for more complete charging of the capacitor.

6. A method according to claim 1 wherein separating each phase of an electrical cycle into a plurality of sections comprises separating each phase of an electrical cycle into an even number of sections.

7. A method according to claim 1 wherein the multiphase inverter system comprises insulated-gate bipolar transistor IGBT switching elements.

8. A method according to claim 1 wherein the multiphase inverter system includes a three-phase inverter system, wherein separating each phase of the electrical cycle into the plurality of sections includes separating the electrical cycle into twelve sections and wherein the twelve sections include said at least one section.

9. A method according to claim 8 wherein a phase current in at least one other of the twelve sections is determined from a changing ratio of a value of the phase current calculated from measured values of the other two phase currents in the multiphase system and a measured value of the phase current.

10. A method according to claim 8 wherein a phase current in at least one other of the twelve sections is determined from measured values of the three phase currents.

11. A method according to claim 1 further comprising calculating an offset value that is subtracted from the measured current value when it is used to calculate the phase current.

12. A control system for a multiphase inverter system, the control system comprising an electric current detection circuit and a processor, the processor being arranged to:
separate each phase of an electrical cycle into a plurality of sections based on an electrical angle of each phase;
receive inputs from the electric current detection circuit, each input indicating a measured phase current in the multiphase inverter system; and
determine a first phase current of a first phase in at least one section of the plurality of sections from a changing ratio of a value of the first phase current calculated from measured values of other phase currents in the multiphase system and a measured value of the first phase current.

13. A control system as claimed in claim 12 wherein the multiphase-phase inverter system includes a shunt resistance and a switching element in series with the shunt resistance and wherein the electric current detection circuit is arranged to detect a current flowing through the shunt resistance and the switching element.

* * * * *